United States Patent [19]
MacLeod et al.

[11] 4,091,919
[45] May 30, 1978

[54] WAFER PACKAGING SYSTEM
[75] Inventors: George M. MacLeod, Los Altos; James F. Riley, Saratoga, both of Calif.
[73] Assignee: Monsanto, St. Louis, Mo.
[21] Appl. No.: 721,013
[22] Filed: Sept. 7, 1976
[51] Int. Cl.² .................. B65D 81/24; B65D 25/12
[52] U.S. Cl. ...................... 206/213.1; 206/309; 206/332; 206/334; 206/445; 206/454; 206/524.8; 206/586; 206/593; 220/337
[58] Field of Search .............. 206/7, 213.1, 205, 309, 206/444, 445, 454, 583, 586, 593, 591, 524.8, 332, 334; 220/17, 23.86, 22, 334, 337

[56] References Cited
U.S. PATENT DOCUMENTS

| | | | |
|---|---|---|---|
| 2,284,551 | 5/1942 | Alexander | 206/213.1 |
| 2,943,731 | 7/1960 | Brown | 206/583 |
| 3,048,668 | 8/1962 | Weiss | 206/328 |
| 3,059,830 | 10/1962 | Kramer | 206/594 |
| 3,365,092 | 1/1968 | Blessing | 220/17 |
| 3,400,809 | 9/1968 | Puente | 220/17 |
| 3,472,568 | 10/1969 | Southwick | 220/17 |
| 3,531,040 | 9/1970 | Myny | 206/523 |
| 3,607,440 | 9/1971 | Fred et al. | 206/334 |

*Primary Examiner*—William Price
*Assistant Examiner*—Joseph M. Moy
*Attorney, Agent, or Firm*—Henry Croskell

[57] ABSTRACT

A wafer packaging system for clean packaging and damage-free transporting of semiconductor wafers. The system includes tubular outer and inner containers, the inner container adapted to be contained by the outer container with the longitudinal axes of both containers extending in the same axial direction. The inner container includes provision for holding a plurality of the semiconductor wafers in spaced face-to-face relationship. The system provides a sealed container arrangement preventing contaminants outside the outer container from contaminating wafers within the inner container. Shock-absorbing features associated with the containers prevent shocks applied to the outer container from damaging the wafers.

2 Claims, 8 Drawing Figures

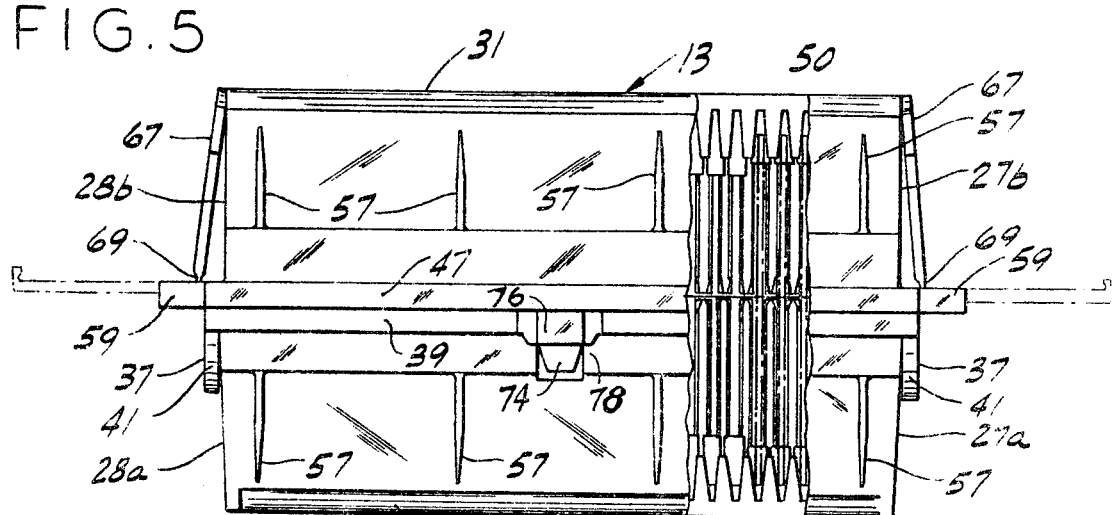
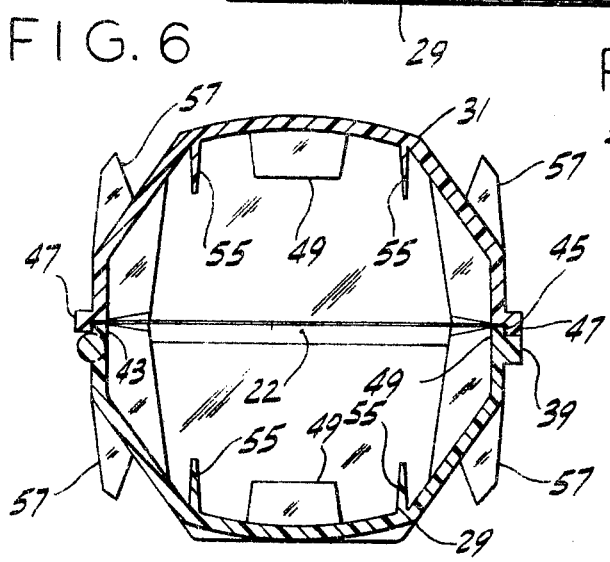
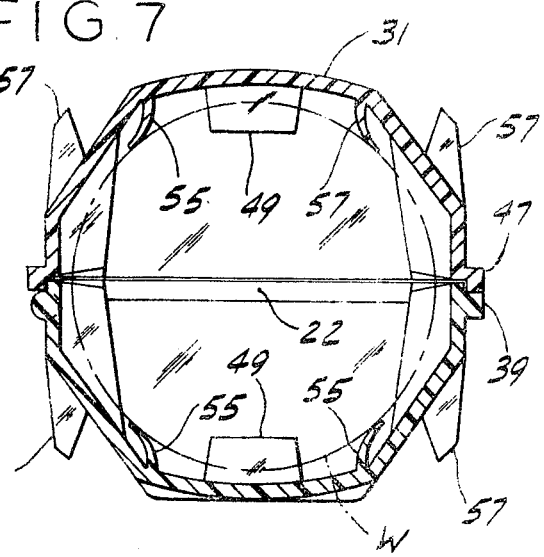
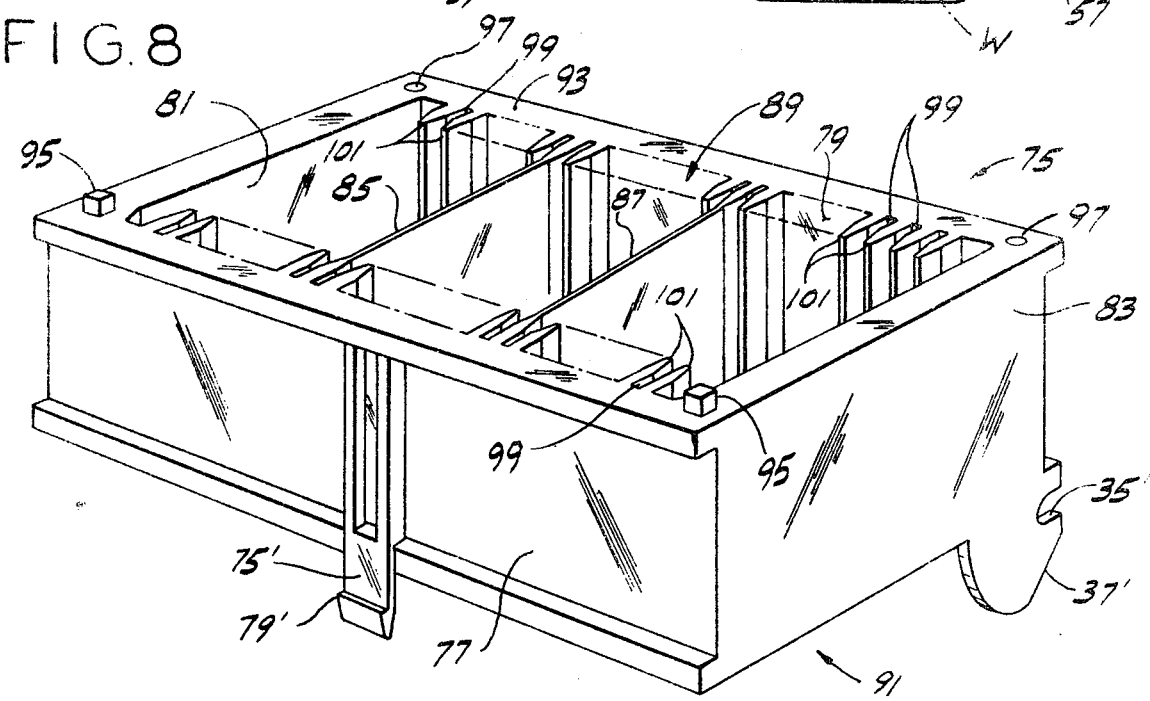

WAFER PACKAGING SYSTEM

BACKGROUND OF THE INVENTION

This invention relates to devices for storing and transporting semiconductor wafers and more particularly to an improved wafer packaging system for clean packaging and damage-free transporting of semiconductor wafers, especially such a system for long-term storage of such wafers.

Electronic devices such as transistors and integrated circuits are made from semiconductor structures, primarily of silicon. Such structures are produced by the epitaxial deposition of silicon or similar materials over a substrate wafer formed of the same material. Generally, the wafers involved must be formed of single crystal silicon with precisely controlled concentrations of dopant impurities.

Typically, the semiconductor wafers have a highly polished surface which must remain free from contact with any foreign surface whatsoever during storage and transporting thereof. It has generally been found that when this polished surface contacts any foreign surface, the surface tends to become contaminated and marred. These slight marrings of the surface and the impurities often materially interfere with effective further processing of the wafers such as growth of epitaxial layers or fabrication of semiconductor devices. In the past, transporting of the wafers between steps in processing thereof has often caused serious problems since it was not always possible to maintain the wafers in a substantially clean atmospheric environment. Furthermore, accidental contact with the surface of such wafers often has occured through inadvertence which, in effect, has made susbsequent processing steps futile and destroyed the value of the wafers.

Several packaging schemes have been employed in past years in an attempt to avoid scratching and contamination of wafers. An early arrangement for silicon wafers was to stack wafers like coins in vials with paper inserts between each slice. This resulted in paper lint on the wafers and did not avoid surface scratches, which often occurred upon unpacking.

Another packaging method involved the use of individual plastic boxes for each wafer, the box having layers of foam rubber placed below and above the wafer. However, this type of package often caused contamination of wafers from shredded foam, was relatively expensive and was time consuming to use.

Glassine bags were employed for a time but it was difficult to insert and remove the wafers from the bags. In addition, the bags were often not entirely contaminant free. Moreover, they did not protect wafers from breakage.

A substantial improvement was represented by the introduction of "dimple tray" wafer packages of molded synthetic resin material and having a flat surface with recessed, or "dimples," each adapted for containing a wafer. Such plastic trays have become widely used because of their many advantages yet they do not ensure completely against contamination of wafers by plastic slivers, mold release agents, solvents and other vaporous contaminants. In addition, while they provide some protection, they do not completely protect against wafer breakage under some conditions. Also wafers must be manually transcribed from such packages for further processing and it is increasingly desirable to avoid such manual steps.

Another problem associated with storage of such wafers is that, over a period of time, the wafers tend to become oxidized. This produces an oxide layer which can interfere with subsequent processing of the wafers into electronic structures and, since it cannot be economically removed without special treatment, may render the wafers totally unfit for use. Such oxidation occurs whenever the wafers are stored in an atmospheric environment and may be affected by humidity or other conditions beyond the control of the wafer manufacturer or purchaser. In any event, oxidation such as this seriously reduces the shelf life of the semiconductor wafers.

In addition to the problems of contamination and oxidation of semiconductor wafers, their shipment to customers poses the problem of maintaining their structural integrity during adverse shipment conditions. For example, droppage or rough handling in shipment resulting in breakage of the semiconductor wafers has been a serious problem. The breakage of just one semiconductor wafer in a package may also cause the loss of several other wafers because small sharp fragments of a broken wafer may settle as dust on other wafers in the package or even severely scratch their surfaces. Hence, other wafers in the package may either require costly cleaning before usage or may be rendered useless because of scratches.

SUMMARY OF THE INVENTION

Among the several objects of the invention may be noted the provision of an improved wafer packaging system; the provision of such a system for clean packaging and damage-free transporting of semiconductor wafers; the provision of such a system providing for long-term storage of such wafers free from contamination and from oxidation; the provision of such a system providing for packaging and transporting of such semiconductor wafers in such a manner that the critical surfaces of the wafers do not contact any foreign surface and are not contacted by other wafers within the same package; the provision of such a system providing for handling of the semiconductor wafers in such a way that the critical surfaces thereof are not contaminated; the provision of such a system permitting transportation and shipment of such wafers without damage thereto even though shipment packages of the present invention may be exposed to rough handling, droppage and severe shock during shipment; the provision of such a system providing for shipment of such wafers in containers which are well suited for mass production manufacture, easy cleaning, reuse and which can be manufactured at relatively low unit cost; and the provision of such a system including wafer packages which are quickly loaded with wafers and which are quickly unloaded all without damage to the wafers.

Briefly, these and other objects are achieved by a wafer packaging system which includes a tubular outer container and a tubular inner container, i.e., cassette, adapted for being contained by the outer container with longitudinal axes of the inner and outer containers extending in the same axial direction. The inner container is adapted for holding a plurality of wafers in spaced, face-to-face relationship. Specifically, the outer container is in the form of a cylindrical metal can having hermetically sealed ends at least one of these ends being removable. The inner container fits generally concentrically within the outer container such that the inner container has side walls resiliently spaced from the interior corresponding side walls of the outer container and end walls resiliently spaced from corresponding ends of the outer container. The outer container and inner container are both filled by a fluid environment, sealed within the outer container, which is noncontaminating and chemically nonreactive to the wafers. Accordingly, the wafers are maintained in a clean environment preventing long-term change in their characteristics. In addition, shocks applied to the outer container are effectively prevented from damaging any of the wafers contained within the inner container.

Other objects and features will be in part apparent and in part pointed out hereinafter.

BRIEF DESCRIPTION OF THE DRAWINGS

FIG. 5 is a side elevation of the cassette partially broken away to illustrate some wafers in place within the cassette, other wafer positions in the cassette being vacant;

FIG. 6 is a transverse section taken along line 6—6 of FIG. 3 illustrating cassette features without wafers in place;

FIG. 7 is a view similar to FIG. 6 but illustrating cassette features when a wafer is in place within the cassette, the wafer being shown in phantom; and FIG. 8 is a perspective view of a transfer fixture of the present system.

Corresponding reference characters indicate corresponding parts throughout the several views of the drawings.

DESCRIPTION OF THE PREFERRED EMBODIMENTS

Figure 1:
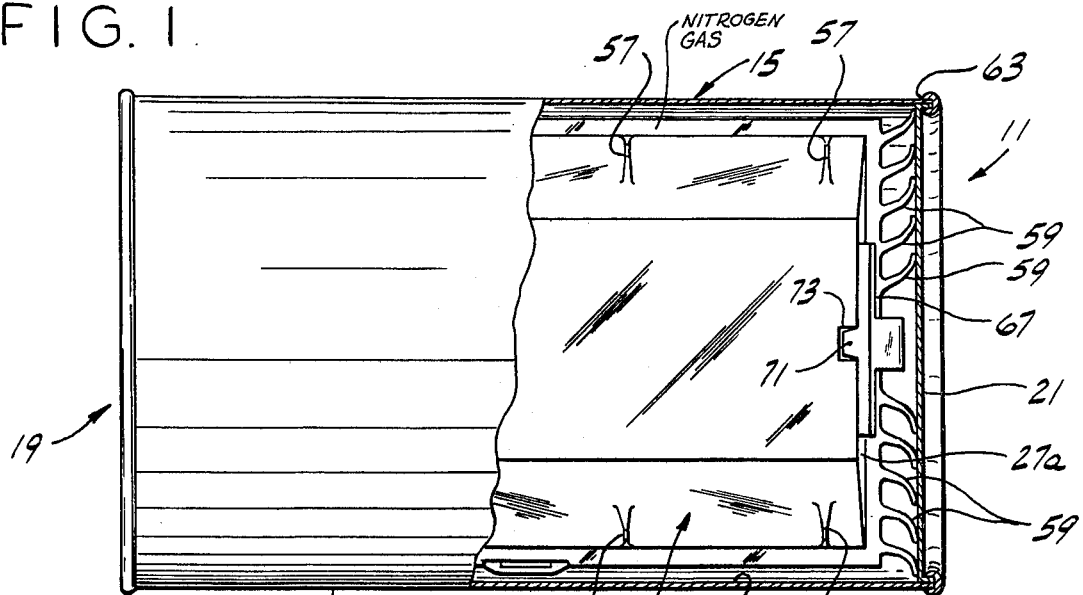
FIG. 1 is a side elevation of a package of the present invention showing the cassette or inner container of the package partly broken away.
Figure 2:
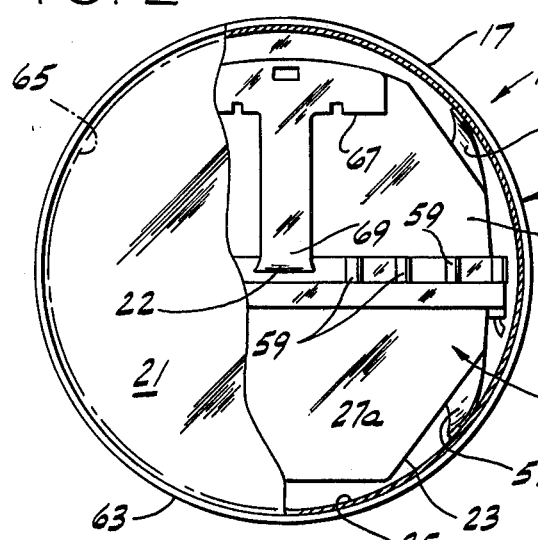
FIG. 2 is an end elevation of the present package showing such a cassette within an outer container or can, this can being partly broken away.
Figure 4:
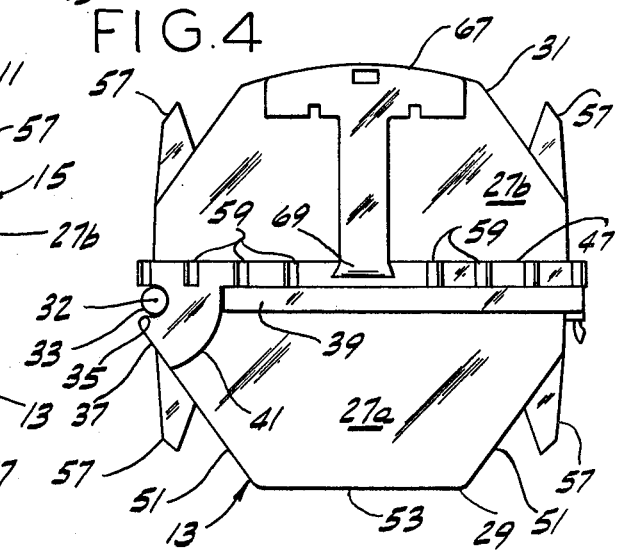
FIG. 4 is an end elevation of the cassette.

Referring now to FIGS. 1 and 2, illustrated generally at 11 is a wafer package in accordance with the invention. Package 11 comprises a tubular two-piece inner container or cassette indicated generally at 13 which is contained within a metal outer container 15. The outer container is similarly tubular and is in the form of a cylindrical can having smooth sidewalls 17 and flat, planar opposite ends 19 and 21. As is shown, inner container 13 fits generally concentrically within outer container 15 with longitudinal axes of tubularity of both containers extending in the same direction. The longitudinal axes are coincident and are designated at 22 in FIG. 2.

The inner container 13, hereinafter referred to as a cassette, is adapted for holding a plurality of semiconductor wafers, such as generally circular wafers, in spaced face-to-face relationship within the cassette, each of the wafers being generally transversed to the longitudinal axis of both the inner and outer containers. Cassette 13 is particularly well suited for containing thin wafers of silicon which are typically circular except for a small flat along one side intended for crystallographic orientation. A typical wafer diameter is about 76 mm, and a typical flat has a chord depth of about 2 mm. Secondary flats may identify wafer types.

As will become more readily understood, side walls (such as wall 23) of the cassette are resiliently spaced from the interior of corresponding side walls 17 of outer container 15 by resilient integral projections which bear against the interior surfaces (such as designated at 25) of outer container 15 with these projections being in a flexed state. Similarly, cassette 13 has end walls designated at 27a, 27b, and at 28a, 28b which are resiliently spaced from the corresponding ends 19, 21 of outer container 15. This spacing is similarly provided by resilient integral projections from the cassette which are in a flexed state when cassette 13 is positioned within outer container 15.

More specifically, cassette 13 comprises a lower half 29 and an upper half 31, each half being of integral, molded composition, preferably of a resilient non-plasticized synthetic resin material, and more preferably, injection molded polypropylene which is white pigmented.

While other materials may be used, because of the deleterious effect on wafers stored within the cassette and possible long-term changes in resilience of the cassette, it is desirable to employ a non-plasticized synthetic resin material or one, the molecular weight of which can be controlled without use of volatile plasticizers or other components. Among the possible materials which may be employed are polyethylene, polycarbonate, and tetraethylfluorocarbon materials sold under the trademark "TEFLON," as well as various polymers, copolymers or terpolymers of either natural or pigment-filled materials. A suitable pigment is a small percentage of $TiO_2$. In any event, the material is required to exhibit a degree of resilience or flexibility in order to provide certain projections of the cassette used for shock-absorbing purposes with a desired non-deformably resilient characteristic.

The cassette halves 29 and 31 are hinged together along a hinge axis 32 extending lengthwise along one side of the cassette and parallel to the axis of tubularity. The hinge is constituted by a small pin-like cylindrical projection 33 extending from each end of lower half 29 which is received by an arcuate slot 35 in a tab-like projection 37 extending downwardly from a corner edge of upper half 31. Each slot 35 extends arcuately around it corresponding projection 33 for permitting the two halves to be opened in hinged relationship yet permitting them to be separated after they have been opened by merely pulling the halves apart. This facilitates loading of wafers into the cassette and transfer of the wafers from the lower half 29 of the cassette using a transer fixture shown in FIG. 8.

It may be seen that separation of the hinge elements is preventing over an arcuate extent of about the first 80°-90° of opening of halves 29 and 31 by the shoulder 40 of a rim 39 which extends around the rectangular opening of lower half 29 against which shoulder bears an arcuate edge 41 of projection 37.

When closed, cassette halves mate together tightly with their openings closely fitted in registry to provide a dust-free seal between the halves for preventing particulate contaminants from entering the cassette when closed. This seal is provided by a lip 43 extending upwardly from the peripheral rim 39 of the lower half 29 and fitting within a corresponding channel 45 of a peripheral rim 47 of upper half 31 (see especially FIG. 6).

Figure 3:
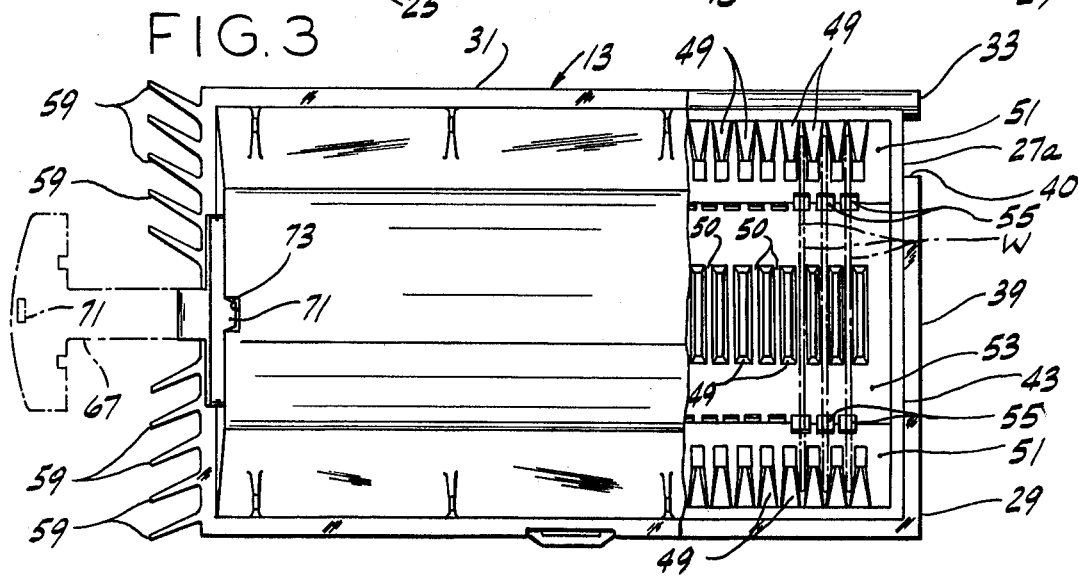
FIG. 3 is a plan view of the cassette showing an integral handle thereof with phantom lines being used to illustrate the handle in an extended position.

Referring to FIG. 3, wafers W (shown in phantom) are held within cassette 13 in the spaced, face-to-face relationship as described above, each wafer being transverse to the lengthwise axis of tubularity of the package, and more specifically each wafer lying in a plane perpendicular to such axis.

Peripheral edges of the wafers are received by spaced grooves defined by inwardly extending integral projections 49 arcuately extending along portions of the interior of planar side walls 51 and similarly along a portion of a planar bottom wall 53 of cassette half 29. The cross-section of the grooves are thus defined by surfaces of projections 49 which are divergent from the bottoms of the grooves (i.e., at their deepest radial extent) toward the interior of the cassette. Accordingly, the critical face surfaces of the wafers are prevented from contacting the groove surfaces. Thus only the peripheral edges of the wafers are ever contacted by portions of the cassette.

In this context, it should be understood that by critical surface is meant that the clean, prepared surface of a wafer which is to be further processed. For example, where such wafers are silicon, either one side (face) or both sides (faces) may be highly polished to an ultra-clean, mirror finish on which an epitaxial layer is to be deposited or other processing carried out by the customer who purchases such wafers for use in making integrated circuits or other silicon semiconductor devices. Any smudge (such as may result from being touched with a finger), or scratch (resulting, for example, with contact with any other wafer or a foreign object), chemical contamination or oxidation render this critical surface useless for further processing. Any dust or other particulate matter on this critical surface may require that the wafer be carefully recleaned, an objectionable effort and expense. For this reason, such wafers prior to shipment to the processing customer or user are best handled with vacuum "tweezers" under ultraclean conditions. These same considerations often hold true for other kinds of semiconductor wafers having clean, prepared surfaces which are critical in the above sense.

FIG. 5 best illustrates the manner in which projections 49 provide tapered-surface grooves 50 and which these projections prevent such critical surfaces from being contacted. Only the peripheral edges or margins of the wafers may contact the surfaces of the grooves. When cassette halves 29 and 31 are closed, however, the wafers are resiliently supported by integrally-molded fingers 55 each in the form of a small, resilient web-like fin adapted for bearing against the periphery of a respective one of each of the wafers. FIG. 6 illustrates that each such finger of fin 55 extends toward the interior of the cassette but in a direcion which is at a slight angle to, but coplanar with, a normal radius extending to axis 22 from the point at which the finger joins the cassette half.

FIG. 7 illustrates that each such finger 55 is in a flexed state when wafers are present in the cassette. There are four such fingers spaced uniformly around each wafer. Hence they provide the sole means of supporting each wafer and serve as a first type of radial shock-absorbing means for preventing shocks radially applied to package 11 (and hence to cassette 13) from damaging the wafers. FIG. 7 also indicates that fingers 55 normally prevent the periphery of any of the wafers from contacting the bottoms of any of the grooves provided by the wafer spacing projections 49.

Referring now again to FIGS. 1 and 2, features for supporting cassette 13 within outer container 15 in shock-absorbing relationship will be understood. A second type of radial shock-absorbing means for preventing shocks radially applied to package 11 from damaging wafers within cassette 13 includes a plurality of integral fins 57 each in the form of a thin web projecting radially outwardly from the exterior surfaces, i.e., the side walls of the cassette. These fins or projections 57 each lie in a transverse plane, as is apparent, but may instead lie in planes generally longitudinal with respect to the package, i.e., parallel to axis 22. The transverse configuration shown is preferred.

As is shown in FIG. 2, fins 57 are spaced uniformly around the circumference of cassette 13 and, when the cassette is placed within outer container 15, fins 57 are in a resiliently flexed state in which they provide radial shock-absorbing support of the cassette within the outer container, i.e., radial shock-absorbing coupling between the cassette and the outer container, in order to prevent shocks radially applied to the package from damaging wafers within the cassette.

The opposite ends of cassette 13 are each provided with a series of projections 59 serving as axial shock-absorbing means for providing shock-absorbing coupling axially between the cassette and outer container 15. Hence, projections 59 prevent shocks axially (i.e., longitudinally) applied to the package from damaging wafers contained within it.

Referring to FIG. 3, projections 59 are carried by upper half 31 of the cassette and are in the form of small integrally molded fins or rectangular webs each extending in a generally longitudinal direction from end portions of rim 47. More specifically, these fins or projections 59 at each end of cassette half 31 are in two sets of five projections regularly spaced along a portion of rim 47 lying to one side of axis 22, each of the projections in each set extending in a direction which is angled slightly radially outward with respect to axis 22. This facilitates flexing of projections 59 when pressed against the interior surface of a corresponding end 19 or 21 of outer container 15.

FIG. 1 illustrates the flexed condition of projections 51 when cassette 13 is contained within outer container 15 with ends 19 and 21 in place, it being understood that the lengthwise dimensions of outer container are selected to produce the flexed condition of projections 51 at both ends of cassette when both ends of outer container 15 are in place.

It may be noted that, while such flexed conditions and resilient character of projections 59 mainly provide the axial shock-absorbing of cassette 13 within outer container 15, projections 57 contribute to such axial shock-absorbing by virtue of their resilient resistance to the longitudinal movement of the cassette within the outer container, there being some static friction between these projections 57 and the interior surface 25 of the outer container.

Outer container 15 is constituted by a can having walls and both ends of steel which is electroplated with tin. Ends 19 and 21 of the outer container are secured and sealed hermetically by conventional double-seaming as that term is known and understood in the can art. At least one of the ends 19 and 21 is preferably secured first, prior to placing cassette 13 within the outer container. Package preparation procedures are explained more fully below. The seams which secure ends 19 and 21 are shown at 61 and 63, respectively. Such seams each include a gasket (not shown) providing a gas-tight hermetic seal.

One opens a package of the invention by employing a can opener of the conventional commercial or domestic type to cut through either of ends 19 and 21 along a shear line 65, the end thus cut open being then removed for permitting the cassette to be withdrawn.

To facilitate withdrawal of cassette 13, a T-shaped handle 67 is an integrally molded part of the cassette, being hinged to each end of the cassette by a thin web 69 extending from rim 57. Normally, each handle 67 lies, generally speaking, in a plane which is parallel to the plane of the end of the cassette to which it is attached, the handle being at the surface of this end of the cassette. It is retained in this by a small dog 71 at the top end of the handle which fits into a corresponding recess 73 at each end of cassette half 31. The handle is rotated on the hinge 69 from this position to the position shown in phantom in FIG. 3 and then grasped for withdrawing the cassette from the outer container.

Cassette halves 29 and 31 are prevented from opening by a clasp comprising an integral tongue 74 which depends from rim 47 of upper half 31 of the cassette and extends into a slot-like aperture 76 which is integral with rim 39 of lower cassette half 29, the tongue having a dog 78 which normally engages a lower edge or lip of aperture 76. The tongue may be depressed to disengage the dog from the aperture lip thereby permitting the tongue to be withdrawn from the aperture for opening cassette halves 29 and 31.

In its fully hermetically sealed condition, outer container 15 (including cassette 13) is filled with a fluid environment which is chemically nonreactive to the wafers and hence permits the wafers to be stored over a long period of time without any substantial change in their physical (and hence electrical) characteristics. For this purpose, it is preferred to employ dry, pure nitrogen gas which is at a pressure slightly greater than normal atmospheric pressure at sea level. This feature prevents degradation of the wafers not only from particulate contamination but also from reaction with wafer vapor, oxygen or other atmospheric contaminants.

The processing steps which result in a package 11 of the invention are in part apparent from the foregoing description but include additional features which are explained below to provide fuller understanding of the invention.

Prior to inserting wafers into either cassette half, both halves 29 and 31 are ultrasonically cleaned in a suitable cleaning medium such as fluorinated hydrocarbon sold under the trademark "FREON," or an aziotropic mixture thereof with acetone, such as sold under the trademark "FREON TA," followed by vapor drying. Outer container 15 is cleaned and dried in the same manner.

Following such rigorous cleaning of the cassette and outer container, prepared wafers of semiconductor materials are loaded into lower half 29 of the cassette utilizing vacuum "tweezers" to avoid marring, scratching or smudging the wafers. A suitable capacity of the cassette is 25 wafers of the diameter (about 76 mm) described above, with spacing of about 4.8 mm between wafers, each wafer having a thickness of about 0.6 mm. The hinge portions of upper half 31 are then mated to corresponding hinge portions of lower half 29, and the two halves are pressed together to engage the clasp. This causes flexing of projections 55 to a "preloaded" state and, as explained above, causes such projections to solely support each wafer with each such wafer being free from contact with the bottom of any of the grooves 50 as noted.

The loaded cassette 18 is then inserted into outer container 15, the latter having one end already double-seam sealed in place. The outer container is then evacuated to a vacuum of 20–25 in Hg and purged by flow of dry high purity nitrogen. With such nitrogen present at a pressure slightly greater (1–2pSig) than sea-level atmospheric pressure, the remaining end of the outer container is placed in position and double-seam sealed, the projections 59 extending from the ends of the cassette being in a flexed state or "preloaded" state of compression for so long as the package remains sealed.

When cassette 13 is removed from outer container 15 in the manner described above, transfer of wafers within the cassette to processing equipment is facilitated by use of a transfer fixture shown in FIG. 8 and designated generally 75. Transfer fixture 75 is referred to hereinafter simply as a guide, since its function is to guide wafers from cassette half 29 into conventional commercial wafer processing equipment.

Guide 75 is of rectangular configuration and is preferably integrally injection molded of a synthetic resin material such as the same material as is employed for cassette 13. Guide 75 includes a pair of opposed parallel side walls 77 and 79 which are spaced by parallel end walls 81 and 83 and a pair of webs 85 and 87 parallel to end walls 81 and 83 thereby to define top and bottom openings 89 and 91 of rectangular shape. It may be noted that while webs 85 and 87 extend across, i.e. trisect, such rectangular openings 89 and 91, the webs serve merely to provide a stiffening effect, rather than to divide openings 89 and 91 into sections.

Openings 89 and 91 and particularly opening 91, are of shape conforming to the rectangular opening of the lower cassette half 29. Hence, opening 91 registers with the opening of cassette half 29. Guide 75 is adapted for being secured or mated to the cassette half 29 with these openings in registry and, for this purpose, includes a pair of slotted projections 37' at each of two corners and corresponding to projections 37 of upper cassette half 31. Slots 35' of projections 37' receive projecions 33 of lower cassette half 29. A tongue 75' corresponding to tongue 75 of upper cassette half 31 includes a dog 79' for engaging the lip of clasp aperture 77 of the lower cassette half.

The upper opening 89 is defined by a partially flanged surface 93 adapted for being fitted to wafer processing equipment of the type referred to above. For this purpose, surface 93 is provided with a pair of rectangular projections 95 which fit apertures of such processing equipment and is provided with a pair of circular apertures 97 which receive corresponding projections of the processing equipment.

Each of side walls 77 and 79 includes a plurality of spaced grooves 99 defined by projections 101 which extend vertically and in parallel, side-by-side relationship along the interior surfaces of walls 77 and 79. Grooves 99 have a cross-section substantially like or identical to the cross-section of grooves 50 of the halves of cassette 13. Accordingly, when guide 75 is mated to cassette half 29, grooves 99 effectively constitute extensions of grooves 50 of cassette half 29 which extend between lower opening 91 and upper opening 89.

To transfer wafers from the cassette to the wafer processing equipment, the cassette halves are separated, guide 75 is mated to lower cassette half 29 with the guide being placed against the wafer processing equipment, this assembly being oriented such that opening 89 is faced downward so that wafers may then slide through grooves 99 under force of gravity and hance be guided into position in the wafer processing equipment. In this way, the wafers are transferred without their critical surfaces being contacted. Accordingly, they remain damage-free and clean up to the point of processing them.

A package of this invention has been drop-tested to demonstrate its ability to protect wafers contained within from damage. For example, repeated drops by hand were made to a synthetic tile floor from a height of about 1.22 meters, causing the package to impact in various orientations, including end first, side wall first, and edge first (i.e., impacting at an angle). In such repeated drops, no damage to silicon wafers in the packages was experienced.

Additionally, packages of the invention containing silicon wafers were placed in cardboard cartons and shipped over long distances and then evaluated with the result that only a minute fraction of wafers so packaged were broken.

In prolonged storage condition, the present package provides extremely long term protection, extending at least months and possibly years, against contamination of wafers or change in their electrical or other physical characteristics. Long term storage tests are continuing and incomplete.

However, such tests so far indicate that the package will provide prolonged storage of wafers without contamination or degradation thereof over temperature extremes of between −45.6° C (−50° F) and 60° C (140° F). By comparison, silicon wafers in conventional packages show development of degrading surface films at prolonged storage over about 32.2° C (90° F).

In view of the foregoing, it will be seen that the several objects of the invention are achieved and other advantages are attained.

As various changes could be made in the above constructions and methods without departing from the scope of the invention, it is intended that all matter contained in the foregoing description or shown in the accompanying drawings shall be interpreted as illustrative rather than in a limiting sense.

What is claimed:

1. In a wafer packaging system for clean packaging and damage-free transporting of semiconductor wafers, said system including a tubular outer container and a tubular inner container adapted to be contained by the outer container in sealed relationship, the longitudinal axes of the inner and outer containers extending in the same axial direction, the improvement comprising handling means for inserting and removing the inner container, the outer container being in the form of a cylindrical can having hermetically sealed ends, at least one of said ends being removable, the inner container fitting generally concentrically within the outer container, the inner container having side walls resiliently spaced from the interior of corresponding side walls of the outer container through fin shock-absorbing means and end walls resiliently spaced from the corresponding ends of the outer container through fin shock-absorbing means, said fin shock-absorbing means aligned with the longitudinal axes providing slide means for loading and unloading the inner container, the outer container and inner container both being filled by a fluid environment sealed within the outer container, said fluid environment being noncontaminating and chemically nonreactive to said wafers, whereby, said wafers are maintained in a clean environment preventing long-term change in the characteristics of said wafers, and shocks applied to the outer container are prevented from damaging said wafers.

2. In a wafer packaging system as set forth in claim 1, each of said wafers being generally transverse to the longitudinal axes of both said inner and outer containers.

* * * * *